US012730132B2

(12) United States Patent
Rock et al.

(10) Patent No.: US 12,730,132 B2
(45) Date of Patent: Sep. 8, 2026

(54) SUBSTRATE-EMBEDDED AC SENSORS

(71) Applicant: Allegro MicroSystems, LLC, Manchester, NH (US)

(72) Inventors: Simon E. Rock, Heidelberg (DE); Emil Pavlov, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 131 days.

(21) Appl. No.: 18/650,318

(22) Filed: Apr. 30, 2024

(65) Prior Publication Data

US 2025/0334612 A1 Oct. 30, 2025

(51) Int. Cl.
*G01R 15/18* (2006.01)
*H05K 1/02* (2006.01)
*H05K 1/03* (2006.01)

(52) U.S. Cl.
CPC ......... *G01R 15/181* (2013.01); *H05K 1/0296* (2013.01); *H05K 1/0366* (2013.01); *H05K 2201/10151* (2013.01); *H05K 2201/10272* (2013.01)

(58) Field of Classification Search
CPC .. G01R 15/181; G01R 15/183; G01R 15/142; G01R 15/207; G01R 19/15; G01R 19/181; G01R 19/165; G01R 19/155; G01R 19/2513; G01R 19/14; G01R 19/25; H05K 2201/10151; H05K 2201/10272; H05K 2201/09227; H05K 2201/086; H05K 1/0296; H05K 1/0366; H05K 1/165
See application file for complete search history.

(56) References Cited

U.S. PATENT DOCUMENTS

| | | | | |
|---|---|---|---|---|
| 6,995,315 | B2 | 2/2006 | Sharma et al. | |
| 7,075,287 | B1 | 7/2006 | Mangtani et al. | |
| 7,166,807 | B2 | 1/2007 | Gagnon et al. | |
| 7,476,816 | B2 | 1/2009 | Doogue et al. | |
| 7,598,601 | B2 | 10/2009 | Taylor et al. | |
| 7,709,754 | B2 | 5/2010 | Doogue et al. | |
| 8,080,994 | B2 | 12/2011 | Taylor et al. | |
| 9,322,806 | B2 * | 4/2016 | Bureau | G01N 27/9006 |
| 9,414,494 | B2 * | 8/2016 | Klein | H05K 1/165 |
| 11,366,141 | B1 * | 6/2022 | Daubert | G01R 15/207 |
| 11,885,866 | B2 | 1/2024 | Vuillermet et al. | |
| 12,306,217 | B2 | 5/2025 | Houis | |

(Continued)

OTHER PUBLICATIONS

U.S. Appl. No. 18/624,540, filed Apr. 2, 2024, Doogue et al.

*Primary Examiner* — Thang X Le
(74) *Attorney, Agent, or Firm* — Daly, Crowley, Mofford & Durkee, LLP

(57) ABSTRACT

AC current sensors are described having a primary current path that is integrated in a substrate or separate from the substrate; one or more conductive loops integrated in the substrate and configured for inductive coupling with the primary current path; and an integrated circuit connected to the conductive loop(s) and configured to measure AC current in the primary current path. The one or more integrated coils or loops can include one or more twisted loops configured to provide differential sensing of current in the primary current path and reject stray magnetic fields. In some embodiments, the one or more integrated coils or loops include one or more pairs of integrated coils or loops, with one coil or loop of each pair on each side of the main current path.

33 Claims, 6 Drawing Sheets

(56) References Cited

U.S. PATENT DOCUMENTS

| | | | | |
|---|---|---|---|---|
| 2013/0104410 | A1* | 5/2013 | Wade | G01C 17/28<br>33/361 |
| 2016/0231364 | A1* | 8/2016 | Nejatali | G01R 19/0092 |
| 2017/0016937 | A1* | 1/2017 | Riehl | H01F 38/14 |
| 2019/0277893 | A1* | 9/2019 | Kashiwaya | G01R 15/18 |
| 2022/0132677 | A1* | 4/2022 | Breymesser | H05K 1/165 |
| 2024/0027560 | A1 | 1/2024 | Vuillermet et al. | |
| 2024/0331914 | A1* | 10/2024 | Rendon Hernandez | H05K 1/165 |

* cited by examiner

SUBSTRATE-EMBEDDED AC SENSORS

BACKGROUND

Current transformer sensors, sometimes referred to as current transformers, are sensors that measure alternating current (AC). Current transformer sensors can offer good bandwidth for some applications but their significant size (bulk)—due to the inclusion of a magnetic core used to surround the current-carrying conductor being measured—can be problematic for other applications where size or footprint of the sensor and related components are circuitry is of particular concern, such as when measuring current on a printed circuit board (PCB).

Other types of AC sensors, such as coreless current sensors, a.k.a., integrated-conductor current sensors, can be used for PCB applications. Coreless current censors are field-sensing sensors that integrate the current conductor, the sensing elements (Hall effect sensing elements), and the signal conditioning circuitry, all in one single package without use of a magnetic core to reduce the footprint of the current sensing functionality.

FIGS. 1A-1B show a prior art integrated-conductor (coreless) current sensor 100 in two different application. As shown in FIG. 1A, integrated-conductor current sensor 100 includes an integrated circuit (IC) 104, shown as packaged and mounted on a substrate 101, e.g., a PCB. A main conductor 102, e.g., an integrated busbar, is shown for providing AC current on the substrate. The main conductor 102 is shown with first and second portions 102*a-b* separated by a necked-down portion 102*c*. IC 104 includes a plurality of Hall effect elements for sensing current. IC 104 is disposed adjacent necked down portion 102*c* and is configured to measure AC current carried by conductor 102.

As shown in FIG. 1B, sensor 100 with IC 104 can be configured in a different application to measure AC current in a busbar 102. IC 104 is shown mounted to substrate (PCB) 102, which is positioned adjacent to busbar 102. Busbar 102 has first and second portions 102*a-b* separated by a necked-down (neckdown) portion 102*c* formed by two notches 102*d* in busbar 102. As for FIG. 1A, IC 104 includes a plurality of Hall effect elements for sensing current. Substrate 101 and IC 104 are configured to measure AC current carried by busbar 102, including through necked down portion 102*c*.

While prior art coreless current sensors such as sensor 100 may be suitable for their intended purposes, these types of current sensors typically do not provide the larger bandwidth provided by current transformer sensors.

SUMMARY

Aspects of the present disclosure are directed to substrate-embedded AC current sensors employing one or more embedded loops in the substrates and related methods.

One general aspect of the present disclosure is directed to and includes an AC current sensor. The AC current sensor can include: a busbar; an integrated coil integrated in a substrate and configured for inductive coupling with the busbar, where the integrated coil includes a twisted loop, and where the integrated coil is configured to provide differential sensing of current in the busbar and to reject stray magnetic fields; and an integrated circuit (IC) connected to the integrated coil and configured to measure ac current in the busbar.

Implementations may include one or more of the following features. The twisted loop of the sensor may include a cross-over portion between first and second coil portions, where the cross-over portion is substantially aligned with a longitudinal axis of the busbar. The substrate may include a printed circuit board (PCB). The busbar can be integrated into the PCB. The PCB may include FR-4. The PCB may include FR-5. The substrate may include a ceramic substrate. The substrate may include a glass substrate including one or more layers of glass alternating with one or more respective layers of metal. The busbar can be integrated into the substrate, in some embodiments. The busbar can be separate from the substrate, in some embodiments.

A further general aspect of the present disclosure is directed to and includes another AC current sensor. The AC current sensor can include: a busbar; an integrated coil integrated in a substrate and configured for inductive coupling with the busbar, where the integrated coil is configured to sense current in the busbar; and an integrated circuit (IC) connected to the integrated coil and configured to measure ac current in the busbar.

Implementations may include one or more of the following features. The substrate of the sensor may include a printed circuit board (PCB). The busbar is integrated into the PCB. The PCB may include FR-4. The PCB may include FR-5. The substrate may include a ceramic substrate. The substrate may include a glass substrate including one or more layers of glass alternating with one or more respective layers of metal. The busbar can be integrated into the substrate, in some embodiments. The busbar can be separate from the substrate, in some embodiments.

An additional general aspect of the present disclosure is directed to and includes another AC current sensor. The AC current sensor also includes a busbar; one or more pairs of coils integrated in a substrate and configured for inductive coupling with the busbar, where each pair of integrated coils includes a first coil and a second coil and is configured to sense current in the busbar and to reject stray magnetic fields; and an integrated circuit (IC) connected to the one or more pairs of integrated coil and configured to measure ac current in the busbar.

Implementations may include one or more of the following features. The sensor where the substrate may include a printed circuit board (PCB). The busbar is integrated into the PCB. The PCB may include FR-4. The PCB may include FR-5. The substrate may include a ceramic substrate. The busbar can be integrated into the substrate, in some embodiments. The busbar can be separate from the substrate, in some embodiments.

Another general aspect of the present disclosure is directed to and includes a method of making an AC current sensor, e.g., of any type disclosed herein. The method can include: providing a primary current path; providing an integrated coil integrated in a substrate, where the integrated coil is configured to detect current in the primary current path; and providing an integrated circuit (IC) connected to the integrated coil and configured to measure ac current in the primary current path.

Implementations may include one or more of the following features. The primary current path may include a busbar. The busbar can be integrated into the substrate, in some embodiments. The integrated coil may include a pair of coils configured to detect current in the busbar and to reject stray magnetic fields, where the pair of coils is disposed symmetrically about a longitudinal axis of the primary current path. The primary current path may include a conductive trace disposed in the substrate. The integrated coil may include a twisted coil configured to detect current in the primary current path and to reject stray magnetic fields. A cross-over portion of the twisted coil can be substantially aligned with a longitudinal axis of the primary current path.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, circuits, and methods providing AC current sensors having a primary current path, e.g., a busbar that is integrated in a substrate or separate from the substrate; one or more conductive loops (windings or coils) integrated in the substrate and configured for inductive coupling with the primary current path; and an integrated circuit (IC) connected to the conductive loop(s) and configured to measure AC current in the primary current path. In some embodiments the one or more integrated coils (loops) include one or more twisted loop(s) configured to provide differential sensing of current in the primary current path and reject stray magnetic fields. In some embodiments, the one or more integrated coils or loops include one or more pairs of integrated coils or loops, with one coil or loop of each pair on each side of the main current path, e.g., on each side of a longitudinal axis or midline of the main current path, with each coil or loop connected to an IC for calculating AC current in the main current path. In some embodiments, the sensors can be calibrated, e.g., by trimming, by adjusting or selecting values in memory such as EEPROM.

Figure 1A:
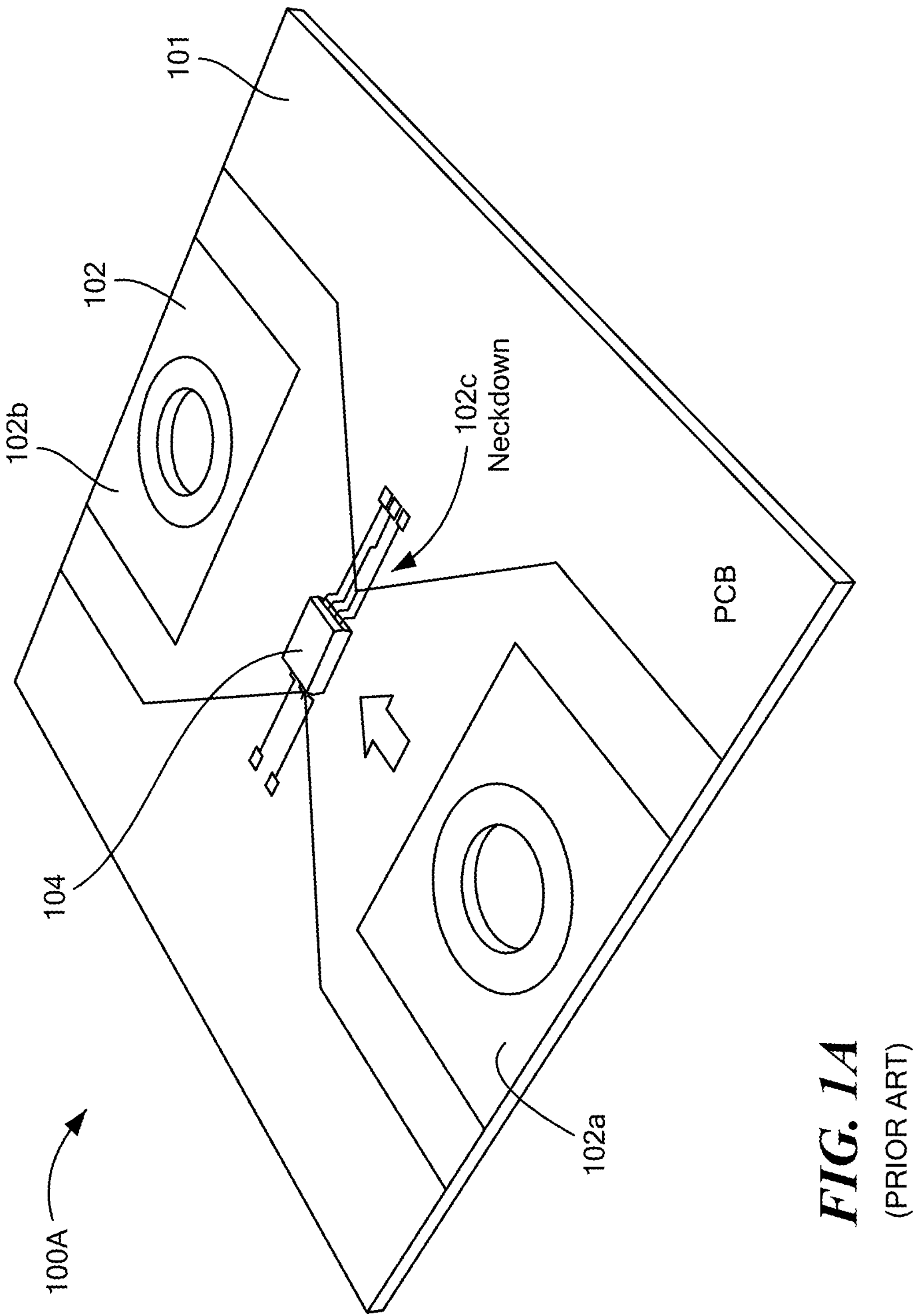
FIGS. 1A-1B show an example prior art integrated-conductor current sensor in two different applications.
Figure 1B:
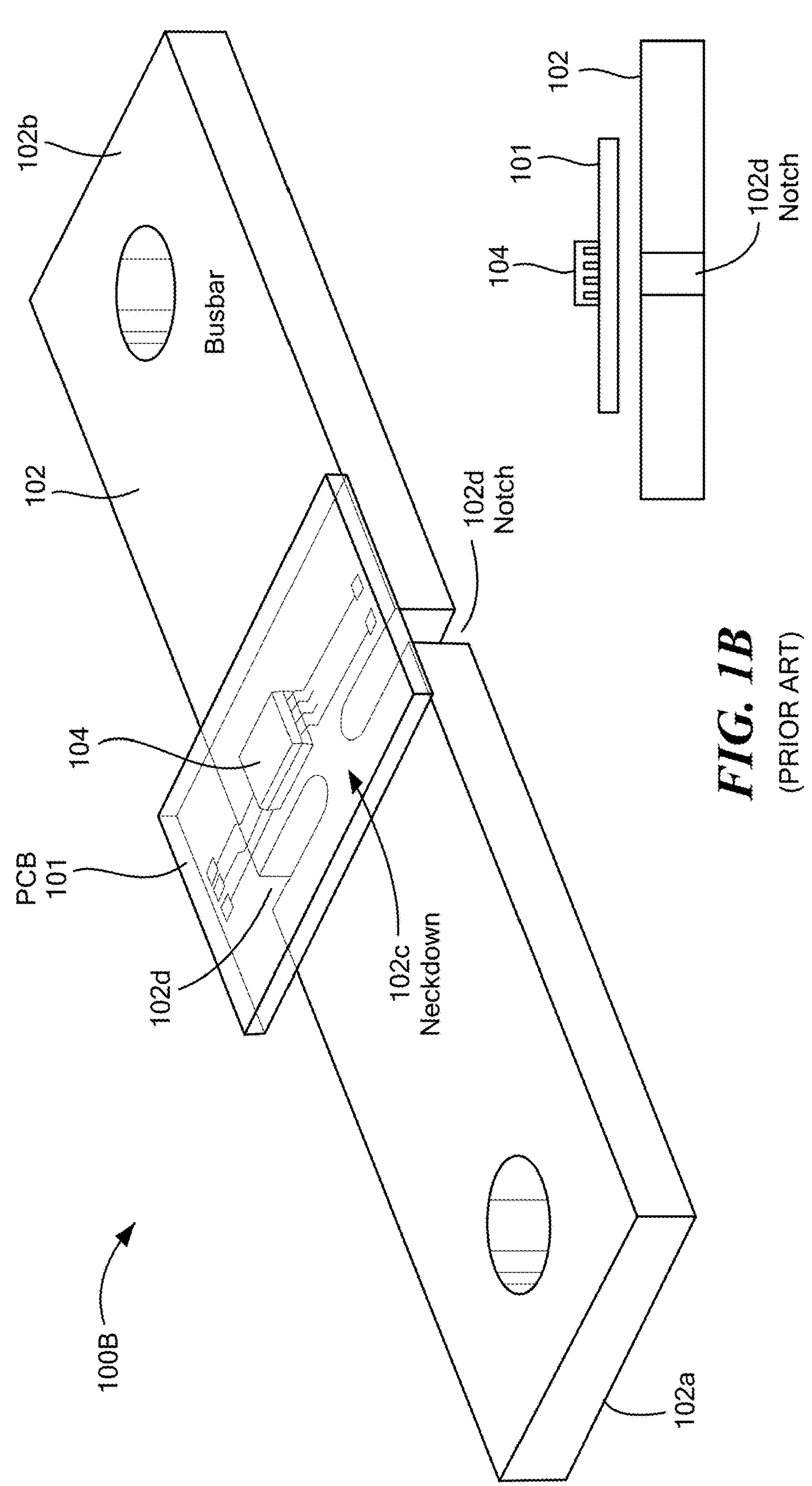
Figure 2:
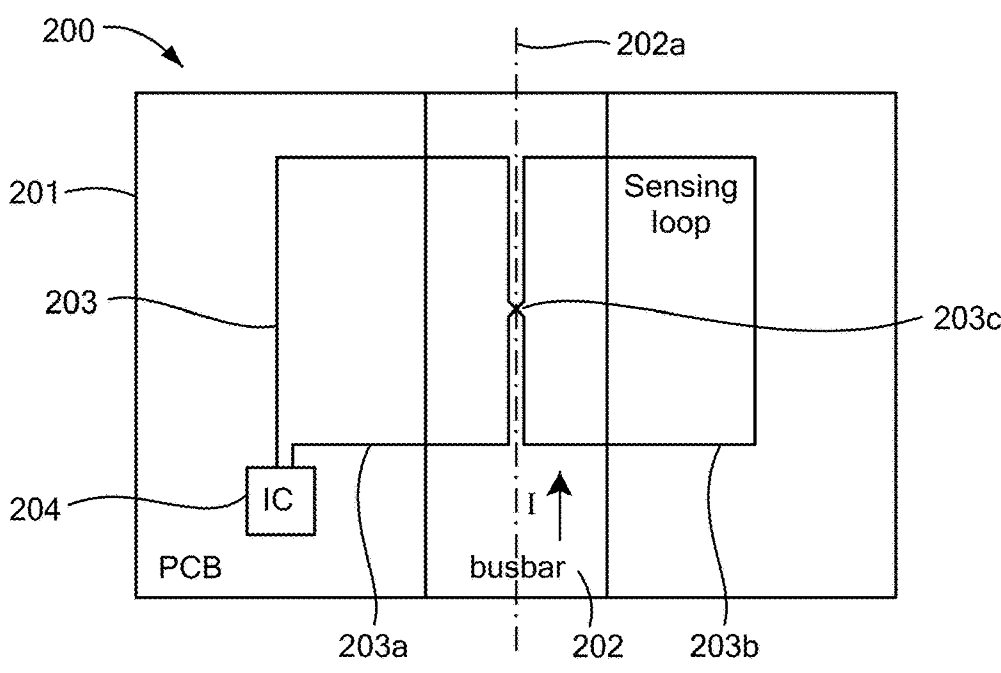
FIG. 2 shows a top view of an example substrate-embedded AC current sensor, in accordance with the present disclosure.

FIG. 2 shows a top view of an example substrate-embedded AC current sensor 200 in accordance with the present disclosure. Sensor 200 includes IC 204 mounted on substrate, e.g., PCB, 201. Integrated busbar 202 is shown for conducting an AC current, with current flow indicated (I). A sensing coil or loop 203 is integrated into substrate 201. Loop 203 includes first and second portions 203*a*-203*b* separated by a crossover portion 203*c*, where one segment of the loop 203 crosses over another segment. An insulator, e.g., insulative tape or other dielectric material, (not shown) may be used to prevent contact of the segments at the crossover portion 203*c*. Insulator material (not shown), e.g., material of the substrate, is disposed between integrated loop 203 and integrated busbar 202 so that the loop 203 and busbar 202 are galvanically separated. Inductive coupling between loop 203 and busbar 202 is utilized for AC current measurement. Suitable substrates 201 can include, but are not limited to, PCBs (e.g., including FR-4, G10, FR-5, etc.), ceramic substrates (e.g., high-temperature cofired ceramic or low-temperature cofired ceramic, glass substrates (e.g., including one or more layers of glass alternating with or adjacent to one or more layers of metal), etc.

In use, the AC in busbar 202 creates varying magnetic field, which induces EMF in the sensing loop 203 according to Faraday's Law of Induction. The induced EMF in the integrated sensing loop 203 is measured by connected IC 204. Because loop 203 is symmetric about the midline 202*a* of busbar 202, the inductive sensing is differential. The magnetic field generated by AC current (I) in the busbar 202 has opposing direction on either side of the midline (longitudinal axis) 202*a* (loop sections 203*a* and 203*b* are shown disposed on the left and right sides or 202*a*, respectively). The twisting of the loop 203 (at cross over section 203*c*) ensures that the differential sensing additively combines the EMF in the two sides (203*a*, 203*b*) of the loop 203 generated due to current in busbar 302 (whereas, in the absence of crossover section 203*c*, those two EMFs would cancel each other). The total magnetic flux from both sides of loop 203 (i.e., sides 203*a* and 203*b*) is summed by the loop 203 due to the twisting at the crossover section 203*c* (aligned on midline 202*a*). IC 204 then measures the induced voltage (EMF) in the loop 203 to determine current flow in the conductor 202.

Due to the symetrical layout of the loop 203 with respect to the center line 202*a* of the busbar 202, the inductive sensing provided by loop 203 will (or will tend to) cancel or reject current due to any ambient stray magentic fields impinging on the loop 203. As a result, sensor 200 is completely or largely stray-field insensitive (SFI).

Figure 3:
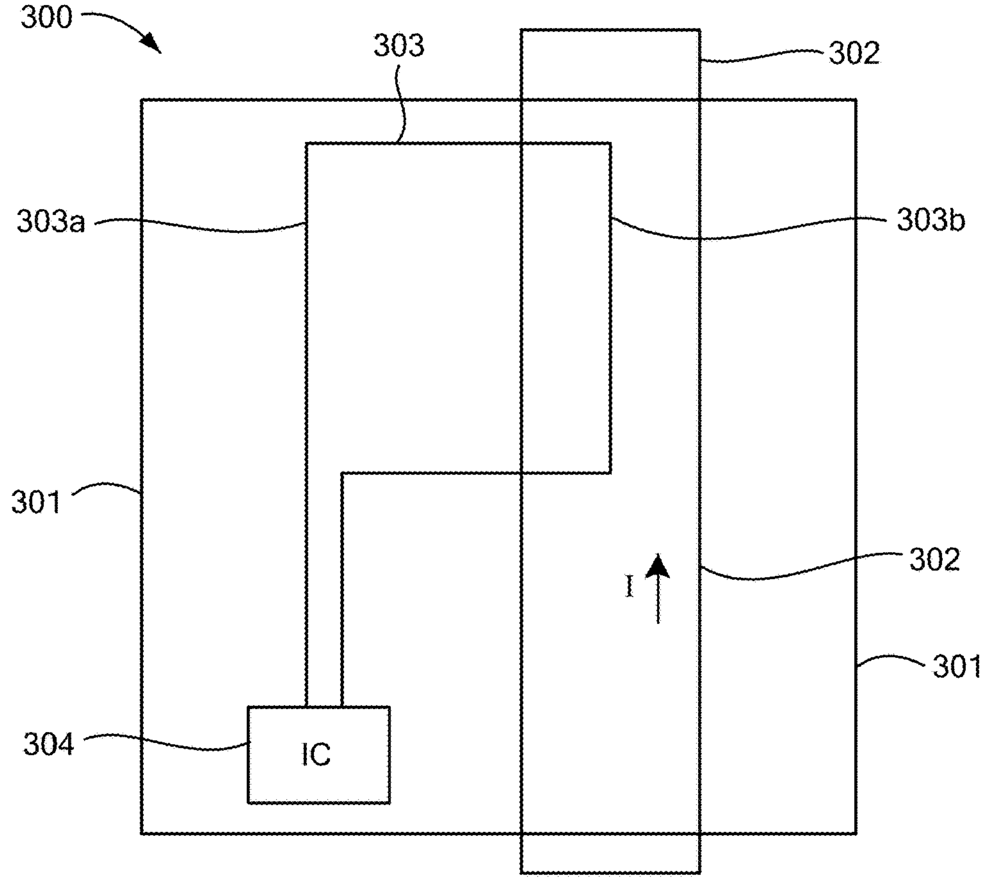
FIG. 3 shows a top view of another example substrate-embedded AC current sensor, in accordance with the present disclosure.

FIG. 3 shows a top view of another example substrate-embedded AC current sensor 300 in accordance with the present disclosure. Sensor 300 includes IC 304 mounted on substrate, e.g., PCB, 301. Integrated busbar 302 is shown for conducting an AC current, with current flow indicated (I). A loop conductive material such as a metal trace (integrated loop) 303 is shown integrated into/on substrate 301 and connected to IC 304. Insulator material (not shown) is disposed between integrated loop 303 and integrated busbar 302 so that the loop 303 and busbar 302 are galvanically separated. Inductive coupling between loop 303 and busbar 302 is utilized for AC current measurement.

In use for AC current measurement, the induced EMF in the integrated sensing loop 303 is measured by IC 304. Due to the non-symetrical layout of the loop (coil) 303 with respect to the center line 302*a* of the main conductor 302, sensor 300 will detect EMF in busbar 302 as well as EMF due to ambient stray magnetic fields.

Figure 4:
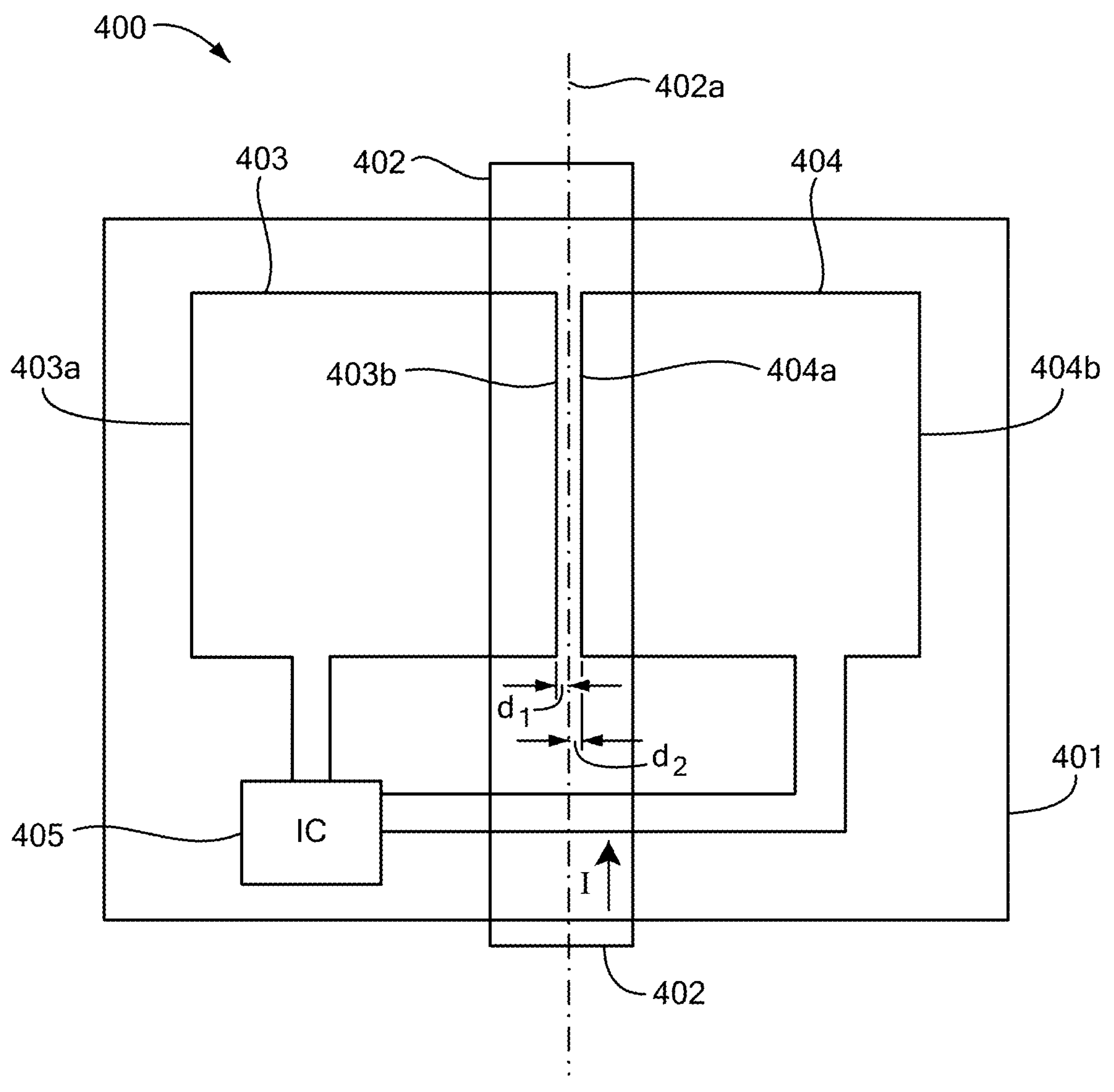
FIG. 4 shows a top view of a further example substrate-embedded AC current sensor, in accordance with the present disclosure.

FIG. 4 shows a top view of a further example substrate-embedded AC current sensor 400 in accordance with the present disclosure. Sensor 400 includes IC 405 mounted on substrate, e.g., PCB, 401. Integrated busbar 402 with midline (longitudinal axis) 402*a* is shown for conducting an AC current, with current flow indicated (I). A pair of sensing coils or loops 403, 404 is integrated into substrate 401, with one integrated loop being positioned on each side of busbar 402, e.g., one loop on each side of the midline 402*a*. While one pair of integrated loops is shown, multiple pairs of integrated loops may be present in other embodiments. Insulator material (not shown), such as material of substrate 401 (e.g., epoxy when substrate 401 is a PCB) is disposed between each of integrated loops 403 and 404 and integrated busbar 402 so that each of the loops 403, 404 is galvanically separated from busbar 402. Inductive coupling between the loops 403, 404 and busbar 402 is utilized for AC current measurement. While one IC 405 is shown, in other embodiments one or more ICs may be connected to each of the coils 403, 404.

For measurement of AC current in busbar 402, AC current flowing through the integrated busbar 402 produces a magnetic field, which induces an EMF (voltage) in each of the the two integrated sensing loops 403, 404. The induced EMF in each of the two integrated sensing loops 403, 404 is measured via IC 405. The IC 405 can combine/process the measurements from loops 403, 404 to determine current in busbar 402. Due the symetrical (or roughly symetrical) layout of the coils with respect to the center line 402*a* of the busbar 402, sensor 400 can be completely or largely stray-field insensitive (SFI). In some embodiments, sensor 400 can becapable of being calibrated, e.g., by a trimming process involving selecting values/settings in memory (e.g., within or coupled to IC 405) such as EEPROM. Such calibration may compensate for differences between the coils 403, 404 in positioning relative to busbar midline 402*a*, e.g., situations where $d_1$ and $d_2$ are not equal or are not equal withing a set or desired tolerance.

Figure 5:
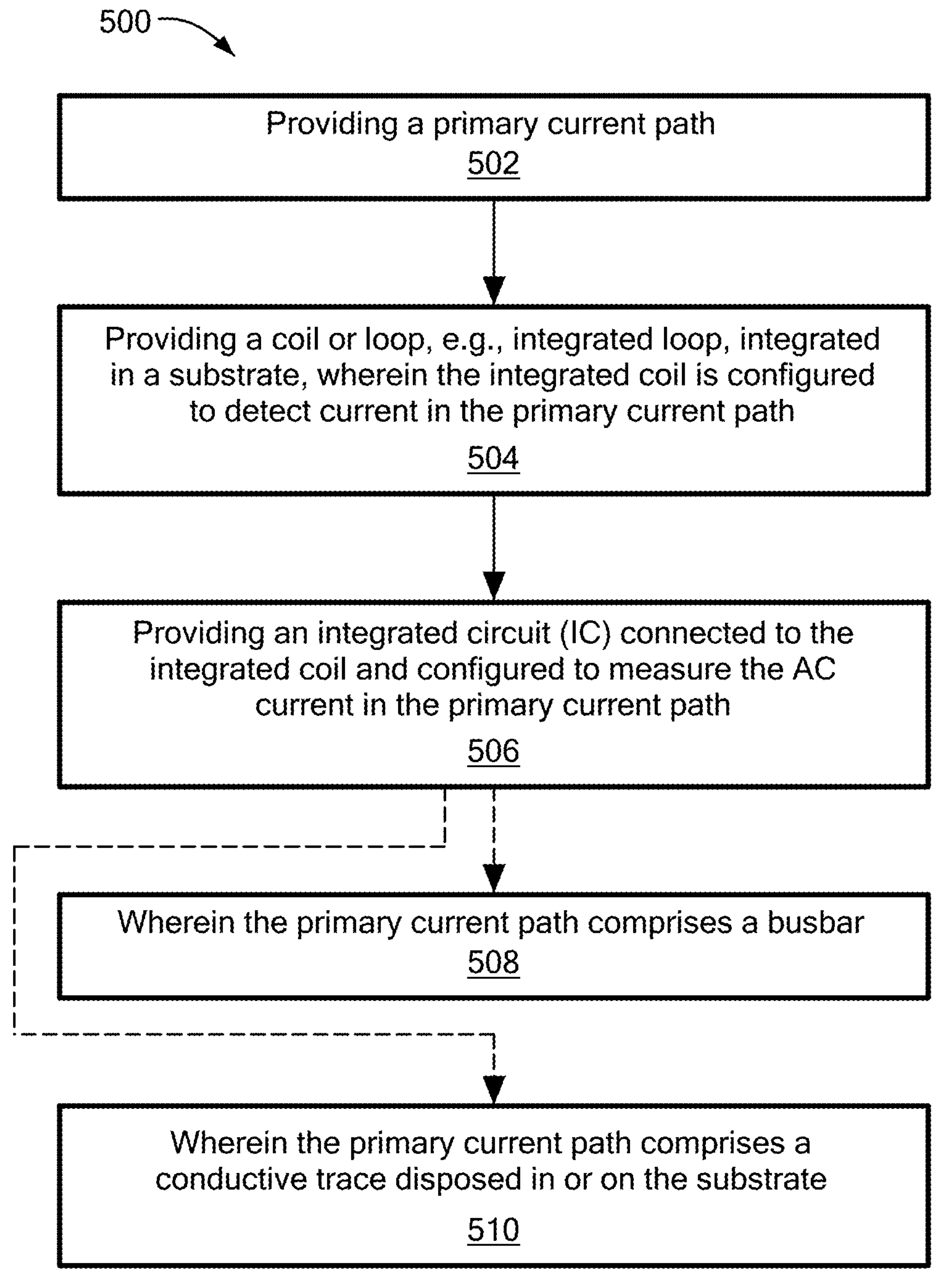
FIG. 5 shows steps in an example method of making a substrate-embedded AC current sensor, in accordance with the present disclosure.

FIG. 5 shows steps in an example method 500 of making a substrate-embedded AC current sensor, in accordance with the present disclosure. Method 500 can include providing a primary current path, e.g., a busbar, as described at 502. A coil or loop, e.g., integrated loop, can be provided for (integrated in) a substrate, where the integrated coil or loop is configured to detect AC current in the primary current path, as described at 504. In some embodiments, one or more pairs of integrated coils or loops may be provided, e.g., integrated in/on a substrate. Suitable substrates can include, but are not limited to, PCBs, ceramic substrates (e.g., high-temperature cofired ceramic or low-temperature cofired ceramic, glass substrates, etc. An integrated circuit (IC) can be provided that is connected to the integrated coil and configured to measure the AC current in the primary current path, as described at 506.

In some embodiments, the primary current path can be or include a busbar or other conductive structure, which may be integrated into the substrate or may be separate from the substrate, as described at 508. In some embodiments, the primary current path can be or include a conductive trace or other conductive structure disposed in or on the substrate, as described at 510.

Figure 6:
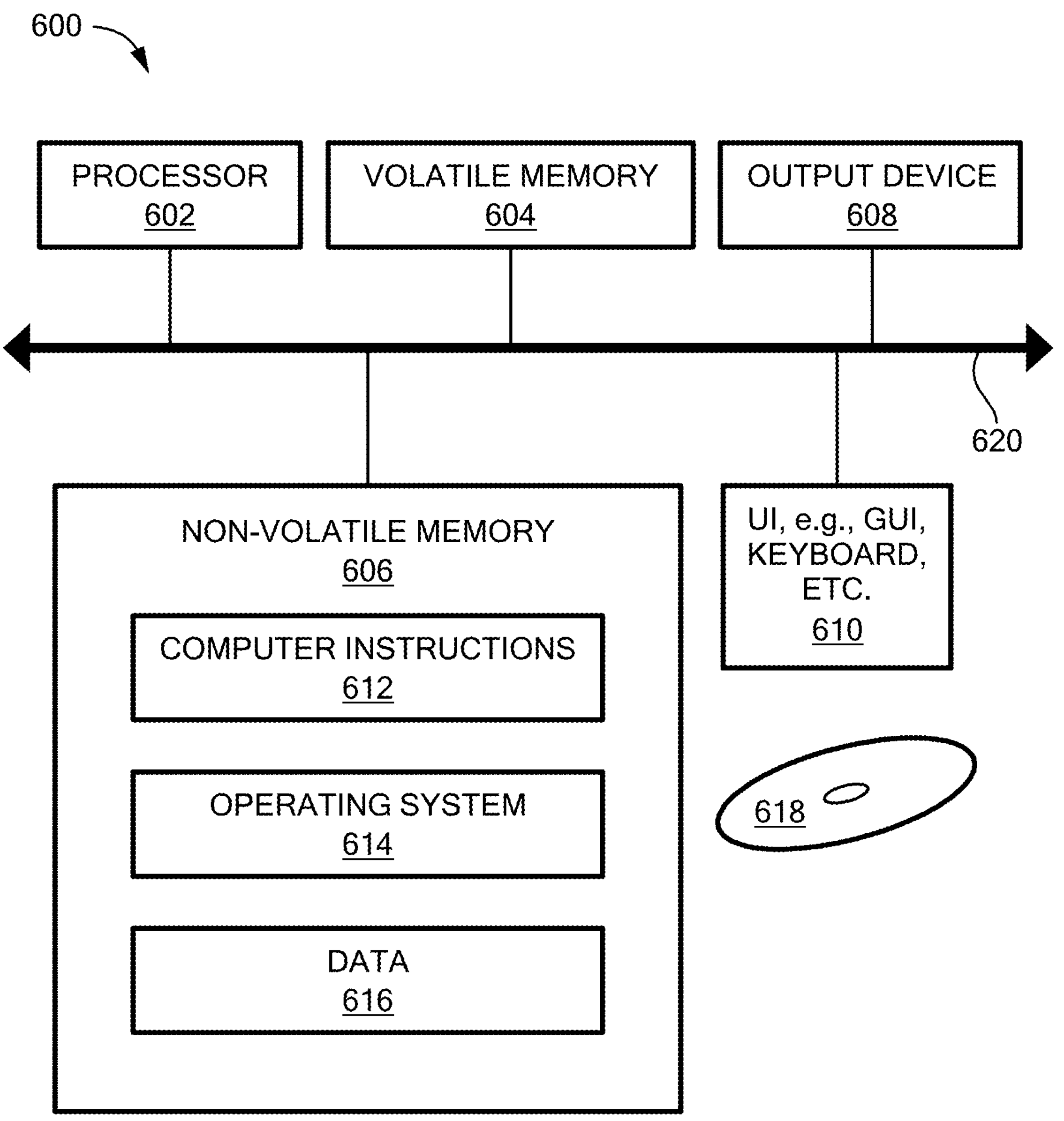
FIG. 6 is a block diagram of an example computer system operative to perform processing, in accordance with the present disclosure.

FIG. 6 is a block diagram of an example computer system 600 operative to perform processing, e.g., as current measurement as described for FIGS. 2-4 herein, in accordance with the present disclosure. Computer system 600 can perform all or at least a portion of the processing, e.g., steps in algorithms and methods for calculating current, described herein. The computer system 600 includes a processor 602, a volatile memory 604, a non-volatile memory 606 (e.g., hard disk, etc.), an output device 608 and a user input or interface (UI) 610, e.g., graphical user interface (GUI), a mouse, a keyboard, a display, and/or any common user interface, etc. The non-volatile memory (non-transitory storage medium) 606 stores computer instructions 612 (a.k.a., machine-readable instructions or computer-readable instructions) such as software (computer program product), an operating system 614 and data 616. In some examples/embodiments, the computer instructions 612 can be executed by the processor 602 out of (from) volatile memory 604. In some examples/embodiments, an article 618 (e.g., a storage device or medium such as a hard disk, an optical disc, magnetic storage tape, optical storage tape, flash drive, etc.) includes or stores the non-transitory computer-readable instructions. Bus 620 is also shown. In some embodiments, one or more components of system 600 can be disposed on or connected to one or more integrated circuits on one or more semiconductor die.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 600 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as special purpose logic circuitry, e.g., an FPGA (field programmable gate array) and/or an ASIC (application-specific integrated circuit). In some examples, digital logic circuitry, e.g., one or more FPGAs, can be operative as one or more processors as described herein.

Accordingly, embodiments of the inventive subject matter can afford various benefits relative to prior art techniques. For example, embodiments and examples of the present disclosure can enable or facilitate e.g., AC current sensors with small footprints that provide relatively high bandwidth.

Various embodiments of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article including a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc., while the term "plurality" can mean any integer number greater than one; however, each of those terms may refer to a fractional value greater than one where context admits, e.g., a "plurality" of windings in a coil may have a fractional value of 1.75, 3.33, 4.6, etc. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. An AC current sensor comprising:

a busbar;

an integrated coil integrated in a substrate and configured for inductive coupling with the busbar, wherein the integrated coil includes a twisted loop, and wherein the integrated coil is configured to provide differential sensing of current in the busbar and to reject stray magnetic fields, wherein the twisted loop includes a cross-over portion between first and second coil portions, wherein the cross-over portion is substantially aligned with a longitudinal axis of the busbar such that electromagnetic fields of the first coil portion and the second coil portion are additively combined during differential sensing of the current in the busbar; and an integrated circuit (IC) connected to the integrated coil and configured to measure AC current in the busbar.

2. The sensor of claim 1, wherein the substrate comprises a printed circuit board (PCB).

3. The sensor of claim 2, wherein the busbar is integrated into the PCB.

4. The sensor of claim 2, wherein the PCB comprises FR-4.

5. The sensor of claim 2, wherein the PCB comprises FR-5.

6. The sensor of claim 1, wherein the substrate comprises a ceramic substrate.

7. The sensor of claim 1, wherein the substrate comprises a glass substrate including one or more layers of glass alternating with one or more respective layers of metal.

8. The sensor of claim 1, wherein the busbar is integrated into the substrate.

9. The sensor of claim 1, wherein the busbar is separate from the substrate.

10. An AC current sensor comprising:

a busbar;

an integrated coil integrated in a substrate and configured for inductive coupling with the busbar, wherein the integrated coil is configured to sense current in the busbar, wherein the integrated coil includes a twisted loop, wherein the twisted loop includes a cross-over portion between first and second coil portions, wherein the cross-over portion is substantially aligned with a longitudinal axis of the busbar such that electromagnetic fields of the first coil portion and the second coil portion are additively combined during differential sensing of the current in the busbar; and an integrated circuit (IC) connected to the integrated coil and configured to measure AC current in the busbar.

11. The sensor of claim 10, wherein the substrate comprises a printed circuit board (PCB).

12. The sensor of claim 11, wherein the busbar is integrated into the PCB.

13. The sensor of claim 11, wherein the PCB comprises FR-4.

14. The sensor of claim 11, wherein the PCB comprises FR-5.

15. The sensor of claim 10, wherein the substrate comprises a ceramic substrate.

16. The sensor of claim 15, wherein the substrate comprises a glass substrate including one or more layers of glass alternating with one or more respective layers of metal.

17. The sensor of claim 10, wherein the substrate comprises a glass substrate including one or more layers of glass alternating with one or more respective layers of metal.

18. The sensor of claim 10, wherein the busbar is integrated into the substrate.

19. The sensor of claim 10, wherein the busbar is separate from the substrate.

20. An AC current sensor comprising:

a busbar;

one or more pairs of coils integrated in a substrate and configured for inductive coupling with the busbar, wherein each pair of integrated coils includes a first coil and a second coil, and is configured to sense current in the busbar and to reject stray magnetic fields, wherein the first coil and the second coil form a twisted loop with a cross-over portion between the first and second coils that is substantially aligned with a longitudinal axis of the busbar such that electromagnetic fields of the first coil and the second coil are additively combined during sensing of the current in the busbar; and an integrated circuit (IC) connected to the one or more pairs of integrated coil and configured to measure AC current in the busbar.

21. The sensor of claim 20, wherein the substrate comprises a printed circuit board (PCB).

22. The sensor of claim 21, wherein the busbar is integrated into the PCB.

23. The sensor of claim 21, wherein the PCB comprises FR-4.

24. The sensor of claim 21, wherein the PCB comprises FR-5.

25. The sensor of claim 20, wherein the substrate comprises a ceramic substrate.

26. The sensor of claim 20, wherein the busbar is integrated into the substrate.

27. The sensor of claim 20, wherein the busbar is separate from the substrate.

28. A method of making an AC current sensor, the method comprising:

providing a primary current path;

providing an integrated coil integrated in a substrate, wherein the integrated coil is configured to detect current in the primary current path, wherein the integrated coil includes a twisted loop that includes a cross-over portion between first and second coil portions of the integrated coil, wherein the cross-over portion is substantially aligned with a longitudinal axis of the primary current path such that electromagnetic fields of the first coil portion and the second coil portion are additively combined during detection of the current in the primary current path; and providing an integrated circuit (IC) connected to the integrated coil and configured to measure AC current in the primary current path.

29. The method of claim 28, wherein the primary current path comprises a busbar.

30. The method of claim 29, wherein the busbar is integrated into the substrate.

31. The method of claim 28, wherein the primary current path comprises a conductive trace disposed in the substrate.

32. The method of claim 28, wherein the twisted loop is configured to reject stray magnetic fields.

33. The method of claim 28, wherein the substrate comprises a printed circuit board (PCB).

* * * * *